(12) United States Patent
Lu et al.

(10) Patent No.: US 10,354,955 B2
(45) Date of Patent: Jul. 16, 2019

(54) GRAPHENE AS INTERLAYER DIELECTRIC

(71) Applicant: QUALCOMM Incorporated, San Diego, CA (US)

(72) Inventors: Ye Lu, San Diego, CA (US); Bin Yang, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 74 days.

(21) Appl. No.: 15/687,362

(22) Filed: Aug. 25, 2017

(65) Prior Publication Data

US 2018/0366413 A1 Dec. 20, 2018

Related U.S. Application Data

(60) Provisional application No. 62/522,024, filed on Jun. 19, 2017.

(51) Int. Cl.
*H01L 23/532* (2006.01)
*H01L 23/528* (2006.01)
(Continued)

(52) U.S. Cl.
CPC ...... *H01L 23/53295* (2013.01); *C01B 32/182* (2017.08); *H01L 21/02115* (2013.01); *H01L 21/02227* (2013.01); *H01L 21/02321* (2013.01); *H01L 21/02362* (2013.01); *H01L 21/31111* (2013.01); *H01L 21/76802* (2013.01); *H01L 21/76822* (2013.01); *H01L 21/76829* (2013.01); *H01L 23/528* (2013.01); *H01L 23/5226* (2013.01); *H01L 23/5329* (2013.01); *H01L 21/02271* (2013.01); *H01L 21/76831* (2013.01); *H01L 21/76877* (2013.01);
(Continued)

(58) Field of Classification Search
CPC .......... H01L 23/53295; H01L 23/5226; H01L 23/528; H01L 23/5222; H01L 21/02115; C01B 32/182

See application file for complete search history.

(56) References Cited

U.S. PATENT DOCUMENTS 8,610,278 B1 * 12/2013 Ott .................... H01L 23/5222
257/379
9,190,316 B2 11/2015 Brink et al.
(Continued)

FOREIGN PATENT DOCUMENTS

| DE | 102015100692 A1 | 7/2016 |
|----|----|----|
| EP | 3082161 A1 | 10/2016 |
| JP | 2017108047 A | 6/2017 |

OTHER PUBLICATIONS

Antonova I.V., et al., "Fluorinated Graphene Dielectric and Functional Layers for Electronic Applications", Chapter 11, Graphene Materials—Advanced Applications, 2017, pp. 211-230.
(Continued)

*Primary Examiner* — Bac H Au
(74) *Attorney, Agent, or Firm* — Qualcomm Incorporated/Seyfarth Shaw LLP

(57) ABSTRACT

An integrated circuit may include multiple back-end-of-line (BEOL) interconnect layers. The BEOL interconnect layers may include conductive lines and conductive vias. The integrated circuit may further include an interlayer dielectric (ILD) between the BEOL interconnect layers. The ILD may include the conductive lines and the conductive vias. At least a portion of the ILD may include a low-K insulating graphene alloy.

17 Claims, 13 Drawing Sheets

(51) Int. Cl.
  *H01L 23/522* (2006.01)
  *H01L 21/311* (2006.01)
  *H01L 21/768* (2006.01)
  *H01L 21/02* (2006.01)
  *C01B 32/182* (2017.01)
  *H01L 29/78* (2006.01)
  *H01L 21/8234* (2006.01)

(52) U.S. Cl.
  CPC .. *H01L 21/823493* (2013.01); *H01L 23/5222* (2013.01); *H01L 23/53228* (2013.01); *H01L 29/78* (2013.01); *H01L 29/7851* (2013.01)

(56) References Cited

U.S. PATENT DOCUMENTS

| | | |
|---|---|---|
| 9,536,964 B2 | 1/2017 | Shiao et al. |
| 2002/0127844 A1 | 9/2002 | Grill et al. |
| 2009/0093100 A1* | 4/2009 | Xia ................... C23C 16/325 438/421 |
| 2012/0139114 A1* | 6/2012 | Zhang ............... H01L 21/76849 257/751 |
| 2016/0268143 A1 | 9/2016 | Chen et al. |
| 2016/0270237 A1 | 9/2016 | Cho et al. |
| 2016/0307791 A1* | 10/2016 | Reber ............... H01L 21/76873 |
| 2018/0005952 A1* | 1/2018 | Zhou ................... H01L 21/485 |
| 2018/0033734 A1* | 2/2018 | Zhou ................ H01L 21/32055 |

OTHER PUBLICATIONS

International Search Report and Written Opinion—PCT/US2018/037520—ISA/EPO—dated Sep. 27, 2018.

* cited by examiner

GRAPHENE AS INTERLAYER DIELECTRIC

CROSS-REFERENCE TO RELATED APPLICATION

The present application claims the benefit of U.S. Provisional Patent Application No. 62/522,024, filed on Jun. 19, 2017, and titled "GRAPHENE AS INTERLAYER DIELECTRIC," the disclosure of which is expressly incorporated by reference herein in its entirety.

BACKGROUND

Field

Aspects of the present disclosure relate to semiconductor devices, and more particularly to interlayer dielectrics.

Background

Interconnect layers are often used to connect different devices together on an integrated circuit. As integrated circuits become more complex, more interconnect layers are employed to provide the electrical connections between devices. More recently, the number of interconnect levels for circuitry has substantially increased due to the large number of transistors that are now interconnected in modern electronic devices. The increased number of interconnect levels for supporting the increased number of transistors involves more intricate processes.

As integrated circuit (IC) technology advances, interconnect geometries are reduced. Reducing the geometry and "pitch" (spacing) between interconnects may cause the interconnects to interfere with each other and affect proper operation.

In particular, as technology scaling continues, the spacing between complementary metal-oxide-semiconductor (CMOS) interconnect metal lines becomes smaller, and interconnect capacitance (e.g., interlayer capacitance and intra-layer capacitance) increases dramatically. Given that interconnect spacing shrinks as technology evolves (e.g., chips become smaller to gain economic benefit), the interconnect capacitance is substantially increased due to a low K-value of conventional interlayer dielectric (ILD) materials.

SUMMARY

An integrated circuit may include multiple back-end-of-line (BEOL) interconnect layers. The BEOL interconnect layers may include conductive lines and conductive vias. The integrated circuit may further include an interlayer dielectric (ILD) between the BEOL interconnect layers. The ILD may include the conductive lines and the conductive vias. At least a portion of the ILD may include a low-K insulating graphene alloy.

A method of making an integrated circuit may include patterning and etching a low-K insulating graphene alloy layer on a middle-of-line (MOL) layer of the integrated circuit. The method may further include forming back-end-of-line (BEOL) interconnect layers. The BEOL interconnect layers may include conductive lines and conductive vias in the patterned low-K insulating graphene alloy layer.

An integrated circuit may include multiple back-end-of-line (BEOL) interconnect layers. The BEOL interconnect layers may include conductive lines and conductive vias. The integrated circuit may further include means for insulating between the BEOL interconnect layers. The means for insulating may include the conductive lines and the conductive vias. At least a portion of the means for insulating may include a low-K insulating graphene alloy.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
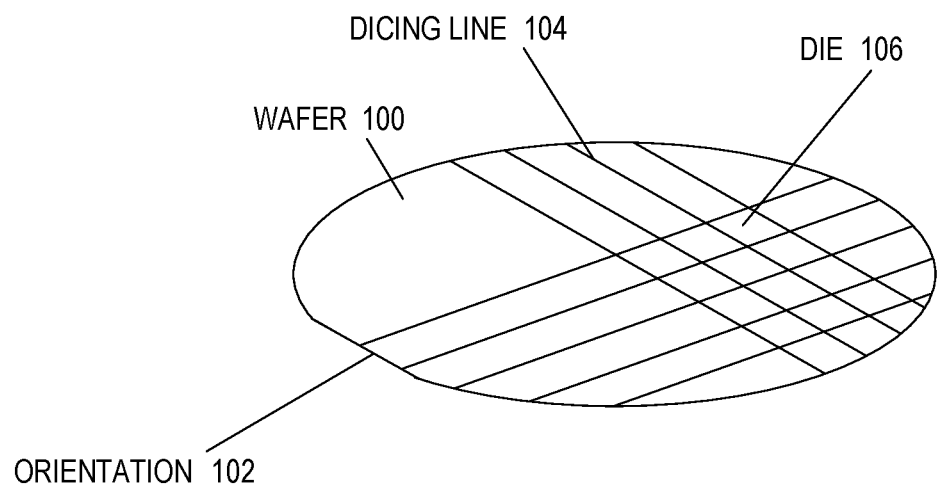
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Complementary metal-oxide-semiconductor (CMOS) fabrication processes are often divided into three parts: a front-end-of-line (FEOL), a middle-of-line (MOL), and a back-end-of-line (BEOL). Front-end-of-line processes include wafer preparation, isolation, well formation, gate patterning, spacers, and dopant implantation. A middle-of-line process includes gate and terminal contact formation. Back-end-of-line processes include forming interconnects and dielectric layers for coupling to the FEOL devices.

Interconnect layers are often used to connect different devices together on an integrated circuit. As integrated circuits become more complex, more interconnect layers provide the electrical connections between devices. More recently, the number of interconnect levels for circuitry has substantially increased due to the large number of transistors that are now interconnected in a modern electronic device. The increased number of interconnect levels for supporting the increased number of transistors involves more intricate processes.

As integrated circuit (IC) technology advances, interconnect geometries are reduced. Reducing the geometry and "pitch" (spacing) between interconnects may cause the interconnects to interfere with each other and affect proper operation.

In particular, as technology scaling continues, the spacing between CMOS interconnect metal lines becomes smaller, and interconnect capacitance (e.g., interlayer capacitance and intra-layer capacitance) increases dramatically. Given that interconnect spacing shrinks as technology evolves (e.g., chips become smaller), a way to reduce the interconnect capacitance may be to reduce a K value of conventional interlayer dielectric (ILD) materials.

A current ILD material is low-K silicon (e.g., silicon carbon oxynitride (SiCON)), whose K value is approximately 2.5. Reducing the K value of current ILD materials, however, is complicated. Therefore, there is a desire for new ILD materials to replace current low-K ILD materials.

It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably unless such interchanging would tax credulity.

Aspects of the present disclosure use fluorinated graphene as an ILD material to at least partially or entirely replace conventional low-K ILD materials, such as SiCON. Advantages include reducing an overall interconnect capacitance by a substantial margin (e.g., 20%-50%). Replacing the conventional low-K ILD materials also substantially improves chip performance, such as chip speed.

According to aspects of the present disclosure, the fluorinated graphene ILD material may be fabricated using chemical vapor deposition (CVD) on a sacrificial catalyst layer. A low resistivity carbon alloy may be diffused and subsequently fluorinated. Alternatively, the fluorinated graphene ILD material may be fabricated by decomposition of atmospheric pressure CVD (APCVD) carbonaceous precursors, and fluorinating a low resistivity carbon alloy. Other processes may also be utilized to fabricate the fluorinated graphene ILD material.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
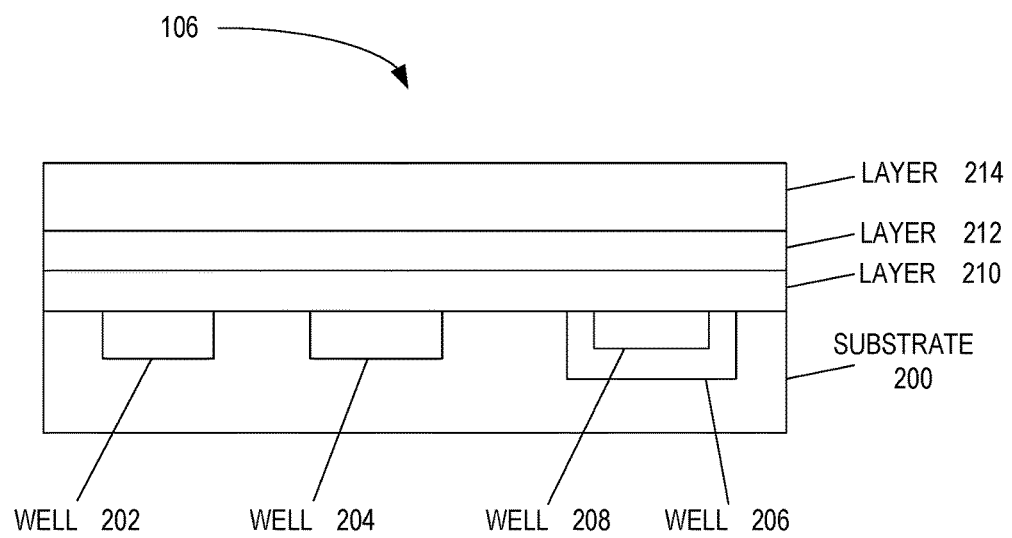
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204 of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
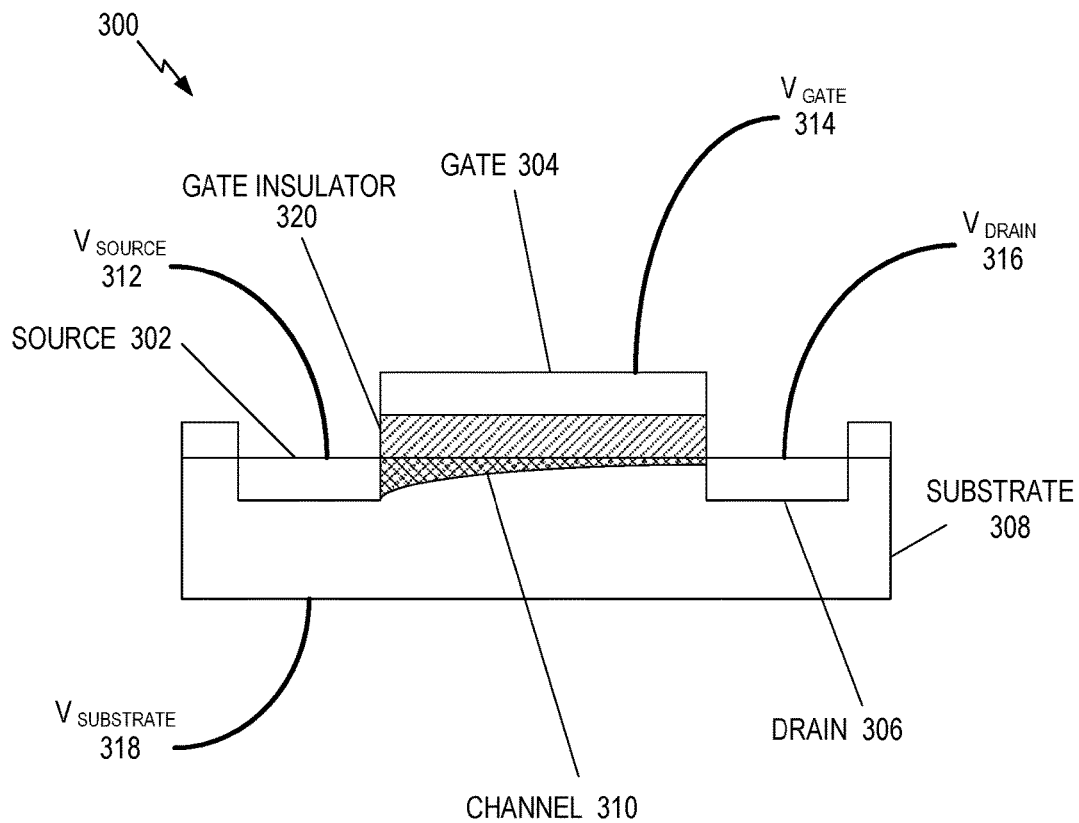
FIG. 3 illustrates a cross-sectional view of a metal-oxide-semiconductor field-effect transistor (MOSFET) device.
Figure 3:
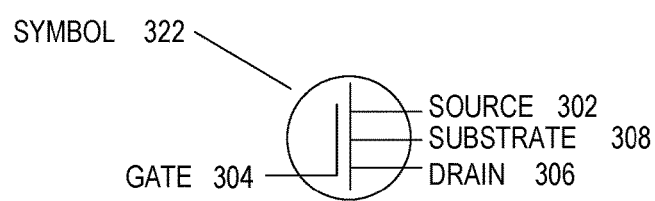

FIG. 3 illustrates a cross-sectional view of a metal-oxide-semiconductor field-effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect layers are used. These interconnect layers may be in one or more back-end-of-line (BEOL) layers, middle-of-line (MOL) layers, (e.g., 210-214), or may be in other interconnect layers of the die 106. An interlayer dielectric (ILD) surrounding the interconnect layers may be replaced with a low-K insulating graphene alloy layer, for example, as illustrated in FIGS. 6A-6F.

Figure 4:
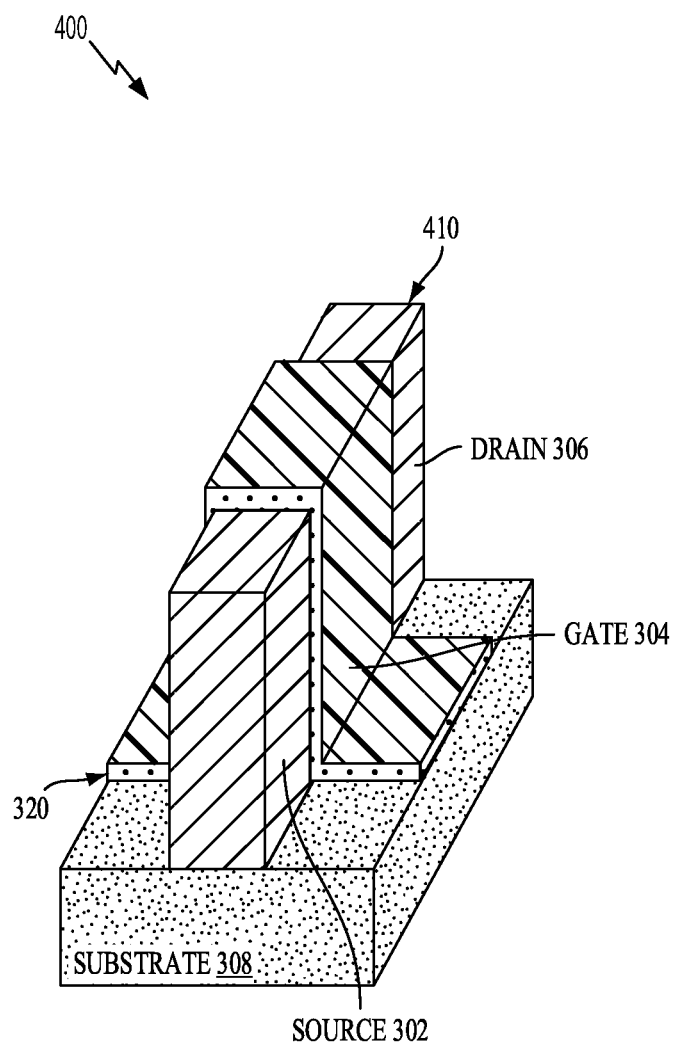
FIG. 4 illustrates a fin field-effect transistor (FinFET).

FIG. 4 illustrates a fin-structured FET (FinFET) 400 that operates in a similar fashion to the MOSFET device 300 described with respect to FIG. 3. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A FinFET transistor is a 3D fin-based metal-oxide-semiconductor field-effect transistor (MOSFET). As a result, the physical size of the FinFET 400 may be smaller than the MOSFET device 300 structure shown in FIG. 3.

This reduction in physical size of the FinFET 400 allows for more devices per unit area on the die 106. Reducing the geometry and "pitch" (spacing) between these devices may cause interconnect layers contacting the devices to interfere with each other and affect proper operation. In particular, as technology scaling continues, the spacing between complementary metal-oxide-semiconductor (CMOS) interconnect layers (e.g., metal lines) becomes smaller, and interconnect capacitance (e.g., interlayer capacitance and intra-layer capacitance) increases dramatically. Given that interconnect spacing shrinks as technology evolves (e.g., chips become smaller), a way to reduce the interconnect capacitance may be to reduce a K value of conventional interlayer dielectric (ILD) materials.

Figure 5:
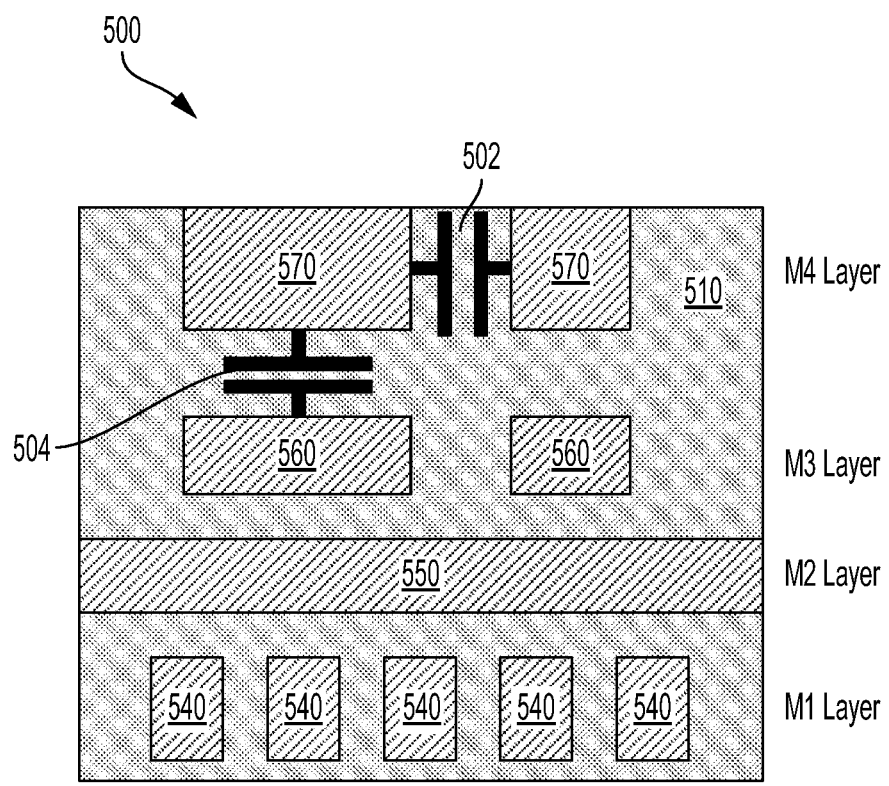
FIG. 5 illustrates a cross sectional view of a conventional integrated circuit (IC) device.

FIG. 5 illustrates a cross sectional view of a conventional integrated circuit (IC) device 500. The IC device 500 may include back-end-of-line interconnect layers 540, 550, 560, and 570 (e.g., M1-M4, etc.). A conventional interlayer dielectric material 510 may surround each of the back-end-of-line interconnect layers 540, 550, 560, and 570. The conventional interlayer dielectric material 510 may be composed of low-K silicon carbon oxynitride (SiCON), or other like low-K dielectric material.

Due to reduced spacing between the back-end-of-line interconnect layers 540, 550, 560, and 570, the IC device 500 experiences an interlayer coupling capacitance 502 as well as an intralayer coupling capacitance 504. The interlayer coupling capacitance 502 and the intralayer coupling capacitance 504 negatively affect performance of the IC device 500. For example, the interlayer coupling capacitance 502 and/or the intralayer coupling capacitance 504 may reduce an operating speed of the IC device 500.

Aspects of the present disclosure reduce the interlayer coupling capacitance 502 as well as the intralayer coupling capacitance 504 by replacing at least a portion of the conventional interlayer dielectric material 510. For example, fluorinated graphene may be used as an interlayer dielectric material to partially or entirely replace the conventional interlayer dielectric material 510. Advantages provided by replacing the conventional interlayer dielectric material 510 include reducing an overall interconnect capacitance by a substantial margin (e.g., 20%-50%), while improving chip performance (e.g., chip speed).

Figure 6A:
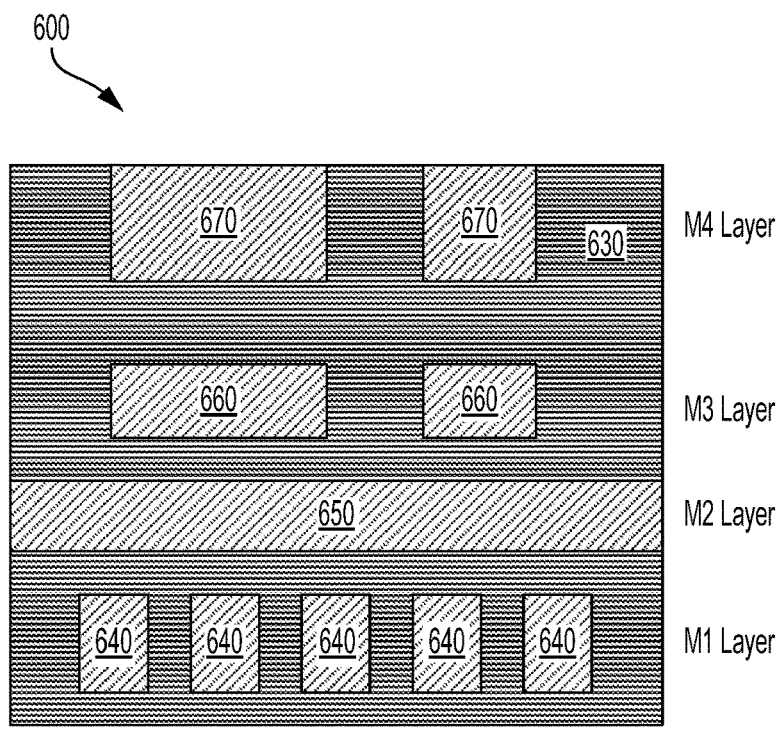
FIGS. 6A-6F illustrate various configurations of an integrated circuit (IC) device including an interlayer dielectric (ILD) between back-end-of-line (BEOL) interconnect layers, in which at least a portion of the ILD includes a low-K insulating graphene alloy, according to aspects of the present disclosure.
Figure 6B:
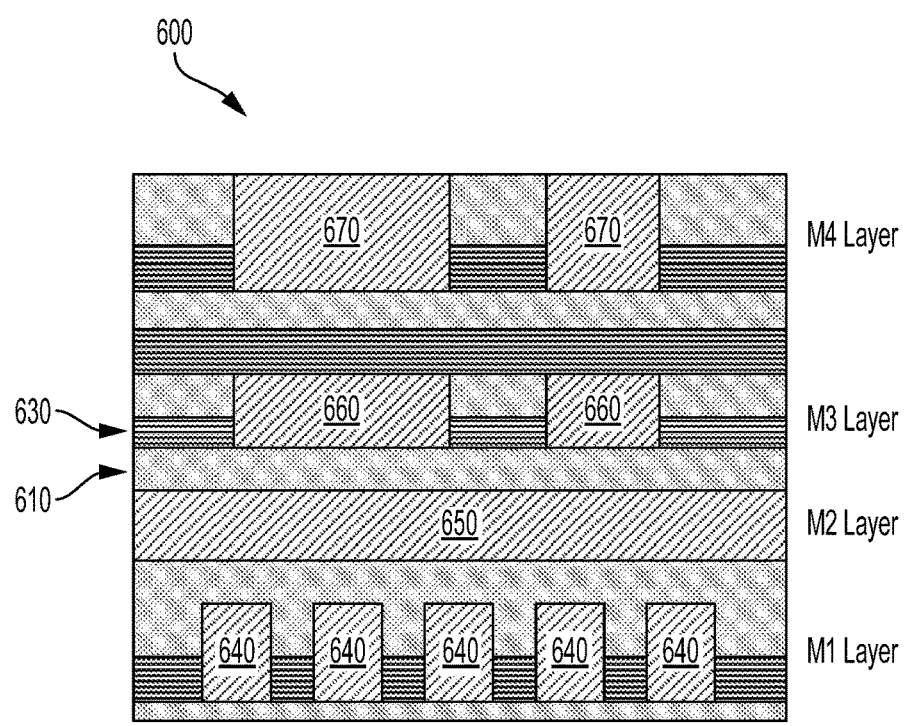

FIGS. 6A-6F illustrate cross sectional views of various configurations of an integrated circuit (IC) device 600 including an interlayer dielectric 610 between back-end-of-line interconnect layers (e.g., 640, 650, 660, and 670). In these examples, at least a portion of the interlayer dielectric 610 includes a low-K insulating graphene alloy 630. In FIG. 6A, the interlayer dielectric 610 is completely composed of the low-K insulating graphene alloy 630. In another example, the interlayer dielectric 610 may include layers of the conventional interlayer dielectric material 510 combined with layers of the low-K insulating graphene alloy 630, as shown in FIG. 6B.

As shown in FIGS. 6A-6F, a first back-end-of-line (BEOL) interconnect layer corresponds to a metal one (M1) BEOL interconnect layer 640, and a second BEOL interconnect layer corresponds to a metal two (M2) BEOL interconnect layer 650. Similarly, a third BEOL interconnect layer corresponds to a metal three (M3) BEOL interconnect layer 660, and a fourth BEOL interconnect layer corresponds to a metal four (M4) BEOL interconnect layer 670. Additional interconnect layers above the M4 BEOL interconnect layer 670 may be included as well.

According to aspects, each of the BEOL interconnect layers (e.g., 640, 650, 660, and 670) includes conductive lines and vias. For example, the M1 BEOL interconnect layer 640 may include five conductive lines, and the M2 BEOL interconnect layer 650 may include one conductive line. Similarly, the M3 BEOL interconnect layer 660 may include two conductive lines, and the M4 BEOL interconnect layer 670 may include two conductive lines (e.g., copper wires). These are exemplary only, and other varying numbers of interconnects (each of different sizes and shapes) as well as conductive vias (not shown) may be included.

FIG. 6A illustrates the IC device 600 where an interlayer dielectric, such as the conventional interlayer dielectric material 510, is completely replaced by the low-K insulating graphene alloy 630 (e.g., fluorographene), according to aspects of the present disclosure. In this example, the low-K insulating graphene alloy 630 completely surrounds each of the BEOL interconnect layers (e.g., 640, 650, 660, and 670).

According to aspects of the present disclosure, the interlayer dielectric may be replaced by the low-K insulating graphene alloy 630 at one or more of the BEOL interconnect layers (e.g., 640, 650, 660, and 670). For example, the conventional interlayer dielectric material 510 may be replaced with the low-K insulating graphene alloy 630 at any combination of BEOL interconnect layers (e.g., 640, 650, 660, and 670).

According to additional aspects, all or some of the interlayer dielectric may be replaced with the low-K insulating graphene alloy 630 at each of BEOL interconnect layers (e.g., 640, 650, 660, and 670). For example, the low-K insulating graphene alloy 630 may replace the conventional interlayer dielectric material 510 in all five of the BEOL interconnect layers, or may be included in four or fewer of the BEOL interconnect layers.

FIG. 6B illustrates the IC device 600 where the interlayer dielectric 610 is partially replaced by the low-K insulating graphene alloy 630 (e.g., fluorographene), according to aspects of the present disclosure. For example, the interlayer dielectric 610 and the low-K insulating graphene alloy 630 may be formed as stripes to surround each of the BEOL interconnect layers (e.g., 640, 650, 660, and 670). For example, the interlayer dielectric 610 and the low-K insulating graphene alloy 630 layers may alternate with each other (e.g., alternating layers). According to an aspect, the interlayer dielectric 610 and the low-K insulating graphene alloy 630 may have various thicknesses, and/or may have similar or different thicknesses.

According to aspects of the present disclosure, the interlayer dielectric 610 may be partially replaced by the low-K insulating graphene alloy 630 at one or more of the BEOL interconnect layers (e.g., 640, 650, 660, and 670). For example, the interlayer dielectric 610 may by partially replaced with the low-K insulating graphene alloy 630 at any combination of the BEOL interconnect layers (e.g., 640, 650, 660, and 670).

According to additional aspects, the low-K insulating graphene alloy 630 may replace the interlayer dielectric 610 at all or some of the BEOL interconnect layers (e.g., 640, 650, 660, and 670). For example, the low-K insulating graphene alloy 630 may partially replace the interlayer dielectric 610 between all five interconnects of the M1 BEOL interconnect layer 640, or may be included between four or fewer of the interconnects of the M1 BEOL interconnect layer 640.

Figure 6C:
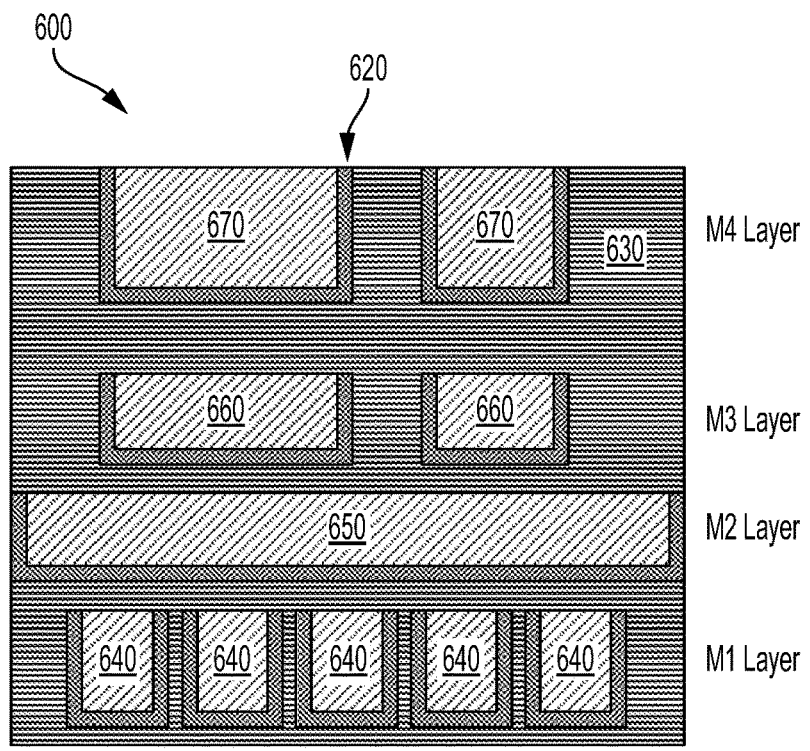

FIG. 6C illustrates the IC device 600 where an interlayer dielectric (e.g., conventional interlayer dielectric material 510 of FIG. 5) is completely replaced by the low-K insulating graphene alloy 630 (e.g., fluorographene), according to aspects of the present disclosure. The low-K insulating graphene alloy 630 may surround each of the BEOL interconnect layers (e.g., 640, 650, 660, and 670). In this example, each of the M1 BEOL interconnect layer 640, the M2 BEOL interconnect layer 650, the M3 BEOL interconnect layer 660, and the M4 BEOL interconnect layer 670 includes a conformal dielectric liner 620 (e.g., silicon nitride (SiNx), tantalum nitride (TaN), cobalt (Co), etc.)

Any combination of the BEOL interconnect layers (e.g., 640, 650, 660, and 670) may include the conformal dielectric liner 620. In this example, the conformal dielectric liner 620 is included on sidewalls and a first surface of each of the BEOL interconnect layers (e.g., 640, 650, 660, and 670). For example, the first surface may face a front-end-of-line (FEOL) layer. The conformal dielectric liner 620 may be included on all or some of the conductive lines of the BEOL interconnect layers (e.g., 640, 650, 660, and 670). For example, the conformal dielectric liner 620 may be included on all five interconnects of the M1 BEOL interconnect layer 640, or may be included on four or fewer of the interconnects of the M1 BEOL interconnect layer 640.

Figure 6D:
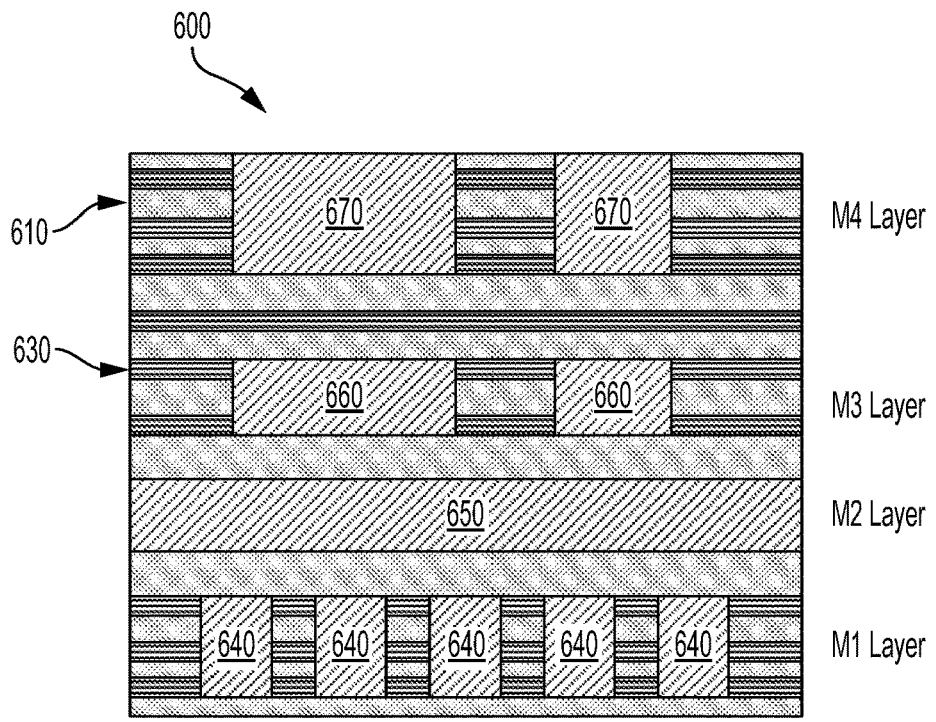

FIG. 6D illustrates the IC device 600 including the interlayer dielectric 610 between each of the BEOL interconnect layers (e.g., 640, 650, 660, and 670). In this example, at least a portion of the interlayer dielectric 610 includes the low-K insulating graphene alloy 630 (e.g., fluorographene). For example, the interlayer dielectric 610 and the low-K insulating graphene alloy 630 may be alternating or non-alternating thin layers. Any combination of BEOL interconnect layers (e.g., 640, 650, 660, and 670) may include the interlayer dielectric 610 and the low-K insulating graphene alloy 630. For example, the M1 BEOL interconnect layer 640, the M3 BEOL interconnect layer 660, and the M4 BEOL interconnect layer 670 may include the interlayer dielectric 610 and the low-K insulating graphene alloy 630, whereas the M2 BEOL interconnect layer 650 does not.

Figure 6E:
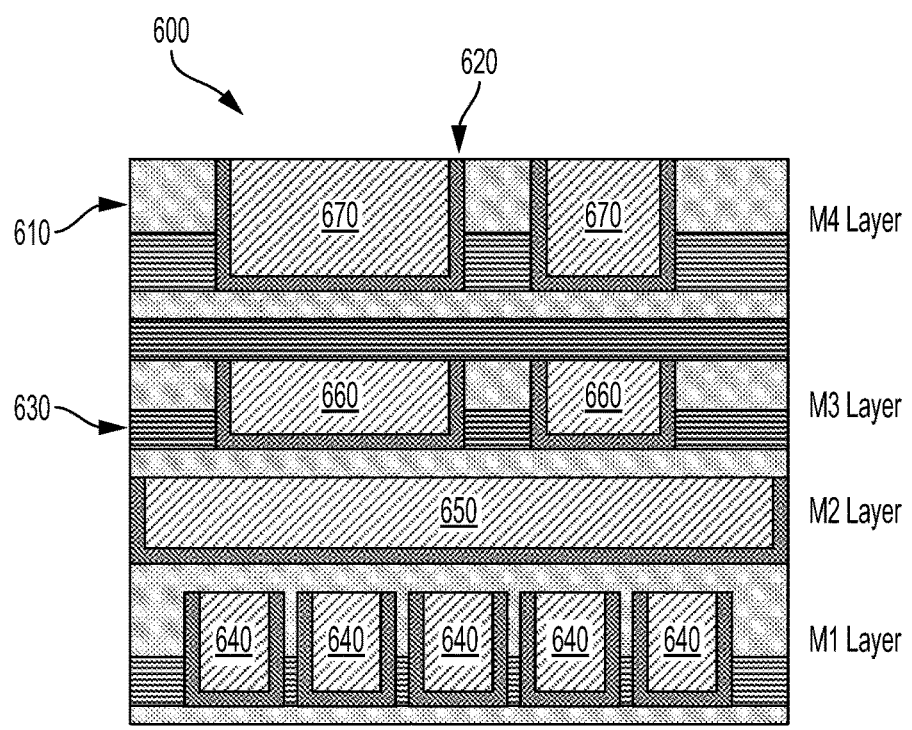

FIG. 6E illustrates the IC device 600 including the interlayer dielectric 610 between the BEOL interconnect layers (e.g., 640, 650, 660, and 670), according to aspects of the present disclosure. In this example, at least a portion of the interlayer dielectric 610 includes the low-K insulating graphene alloy 630. Additionally, each of the BEOL interconnect layers (e.g., 640, 650, 660, and 670) may include the conformal dielectric liner 620 (e.g., SiNx, TaN, Co, etc.). For example, the conformal dielectric liner 620 may at least partially surround each of the BEOL interconnect layers (e.g., 640, 650, 660, and 670). The interlayer dielectric 610 and the low-K insulating graphene alloy 630 may have similar or different thicknesses. The low-K insulating graphene alloy 630 and the conformal dielectric liner 620 may be included in some of the BEOL interconnect layers (e.g., 640, 650, 660, and 670), and between some of the interconnects of the BEOL interconnect layers (e.g., 640, 650, 660, and 670).

Figure 6F:
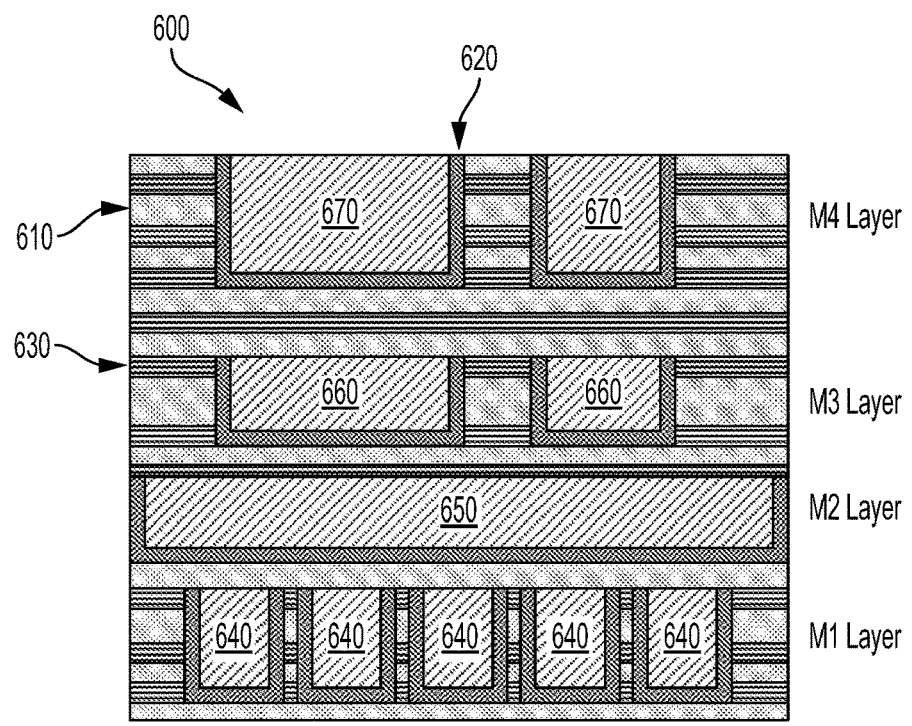

FIG. 6F illustrates the IC device 600 including the interlayer dielectric 610 between the BEOL interconnect layers (e.g., 640, 650, 660, and 670), according to aspects of the present disclosure. In this example at least a portion of the interlayer dielectric 610 includes the low-K insulating graphene alloy 630. Each of the BEOL interconnect layers (e.g.,

640, 650, 660, and 670) may include the conformal dielectric liner 620. For example, the interlayer dielectric 610 and the low-K insulating graphene alloy 630 may be alternating thin layers and may be included in any combination of the BEOL interconnect layers (e.g., 640, 650, 660, and 670) or between some of the interconnects of each of the BEOL interconnect layers (e.g., 640, 650, 660, and 670).

Although the interlayer dielectric 610 and the low-K insulating graphene alloy 630 have been illustrated as substantially linear layers, according to additional aspects of the disclosure, the interlayer dielectric 610 and the low-K insulating graphene alloy 630 may be non-linear, have varied widths, be checker patterned, rounded, etc., such that each of the BEOL interconnect layers (e.g., 640, 650, 660, and 670) are at least partially surrounded. For example, the conformal dielectric liner 620 may at least partially surround some of the BEOL interconnect layers (e.g., 640, 650, 660, and 670), while other BEOL interconnect layers do not include the conformal dielectric liner 620. According to aspects, the conformal dielectric liner 620 liner may be from 1 nm to 5 nm, and the low-K insulating graphene alloy 630 may be from 1 nm to 40 nm. Of course these ranges are exemplary only, and other thicknesses are possible.

According to additional aspects of the disclosure, the low-K insulating graphene alloy 630 may include fluorographene, oxidized graphene, or hydrogenated graphene. Additionally, the low-K insulating graphene alloy 630 may include any graphene related material with low polarizability. For example, fluorographene with a C—F (carbon-fluorine) bond, C—O (carbon-oxygen) bond, C—H (carbon-hydrogen) bond, etc., and any graphene carbon related material with low polarizability may be used. This is because in general, K is proportional to a material's electronic polarizability.

Figure 7A:
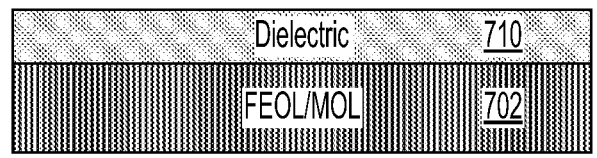
FIGS. 7A-7C illustrate a fabrication process for fabricating an integrated circuit (IC) device, according to aspects of the present disclosure.
Figure 7B:
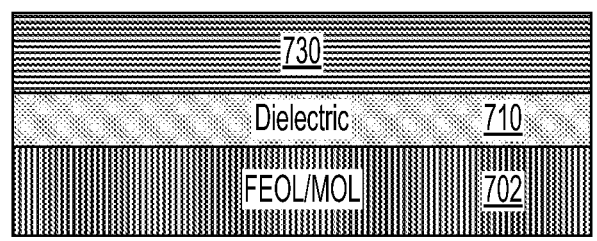
Figure 7C:
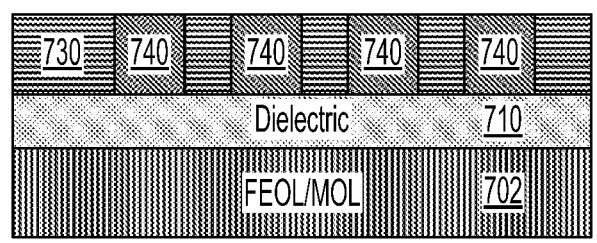

FIGS. 7A-7C illustrate a fabrication process for fabricating an integrated circuit (IC) device, according to aspects of the present disclosure.

FIG. 7A illustrates a wafer 702 (e.g., a substrate) with finished FEOL and MOL layers. According to an aspect, a dielectric layer 710 may be formed over the wafer 702. For example, the dielectric layer 710 may be epitaxially grown on the wafer 702. The dielectric layer 710 is optional.

FIG. 7B illustrates a fluorographene layer 730 (e.g., low-K insulating graphene alloy) deposited on the wafer 702. According to an aspect, the fluorographene layer 730 may be deposited over the dielectric layer 710. For example, a sacrificial catalyst layer (e.g., titanium (Ti)) may be deposited on the MOL layer of the wafer 702. A low resistivity carbon alloy may be diffused through the sacrificial catalyst layer. For example, a chemical vapor deposition (CVD) process involving methane (CH$_4$) may form graphene for diffusion through a grain boundary of the sacrificial catalyst layer to an interface of, for example, Ti/TiN. The sacrificial catalyst layer may then be removed. The low resistivity carbon alloy may then be fluorinated to form the fluorographene layer 730. Alternatively, a graphene layer may be transferred from another wafer, in which fluorographene may be added before or after the transfer.

FIG. 7C illustrates an M1 BEOL interconnect layer 740 (e.g., conductive interconnects and vias) formed in the fluorographene layer 730 on the wafer 702. A lithography, deposition, and lift off process may be used to deposit a conductive metal (e.g., copper (Cu)) in the fluorographene layer 730. Subsequently, similar processes as described above may be repeated to deposit additional layers of the dielectric layer 710 and the fluorographene layer 730 to subsequent BEOL interconnect layers (e.g., M2 and up).

Figure 8A:
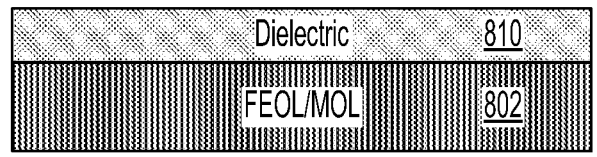
FIGS. 8A-8C illustrate a fabrication process for fabricating an integrated circuit (IC) device, according to aspects of the present disclosure.
Figure 8B:
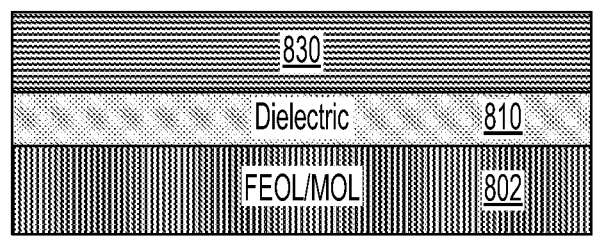
Figure 8C:
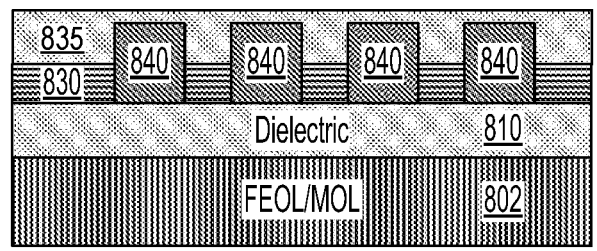

FIGS. 8A-8C illustrate a fabrication process for fabricating an integrated circuit (IC) device, according to aspects of the present disclosure.

FIG. 8A illustrates a wafer 802 (e.g., a substrate) with finished FEOL and MOL layers. A dielectric layer 810 may be formed over the wafer 802. For example, the dielectric layer 810 may be epitaxially grown on the wafer 802. The dielectric layer 810 is optional.

FIG. 8B illustrates a thin fluorographene layer 830 (e.g., low-K insulating graphene alloy), deposited on the wafer 802. For example, the thin fluorographene layer 830 may be one to five nanometers thick. The thin fluorographene layer 830 may be deposited over the dielectric layer 810.

According to an aspect of the present disclosure, a thin sacrificial catalyst layer (e.g., titanium (Ti)) may be deposited on the MOL layer of the wafer 802. A low resistivity carbon alloy may be diffused through the sacrificial catalyst layer. For example, a chemical vapor deposition (CVD) process using methane (CH$_4$) may form graphene for diffusion through a grain boundary of the sacrificial catalyst layer to an interface. The interface may include, for example, Ti/TiN. The sacrificial catalyst layer may then be removed. The low resistivity carbon alloy may then be fluorinated to form the thin fluorographene layer 830.

Alternatively, a thin catalyst layer may be deposited on the MOL layer, followed by decomposing carbonaceous precursors from the thin catalyst layer. A low resistivity carbon alloy may then be fluorinated.

FIG. 8C illustrates an M1 BEOL interconnect layer 840 formed in the thin fluorographene layer 830 of the wafer 802. For example, a low-K interlayer dielectric (ILD) (e.g., silicon carbon oxynitride (SiCON)) 835 may be deposited or grown on the thin fluorographene layer 830. Lithography, deposition, and a lift off process may then be used to deposit a conductive metal (e.g., copper (Cu)) in the thin fluorographene layer SiCON structure 830/835. Subsequently, similar processes as described above may be repeated to deposit additional layers of dielectric layer 810 and additional layers of the thin fluorographene layer 830 to subsequent BEOL interconnect layers (e.g., M2 and up).

Advantages of using a low-K insulating graphene alloy to at least partially replace conventional ILD materials is that it does not involve a change in FEOL/MOL processes. This is because no additional mask is added. Thus, no significant costs are incurred when using the low-K insulating graphene alloy as part of an ILD.

Figure 9:
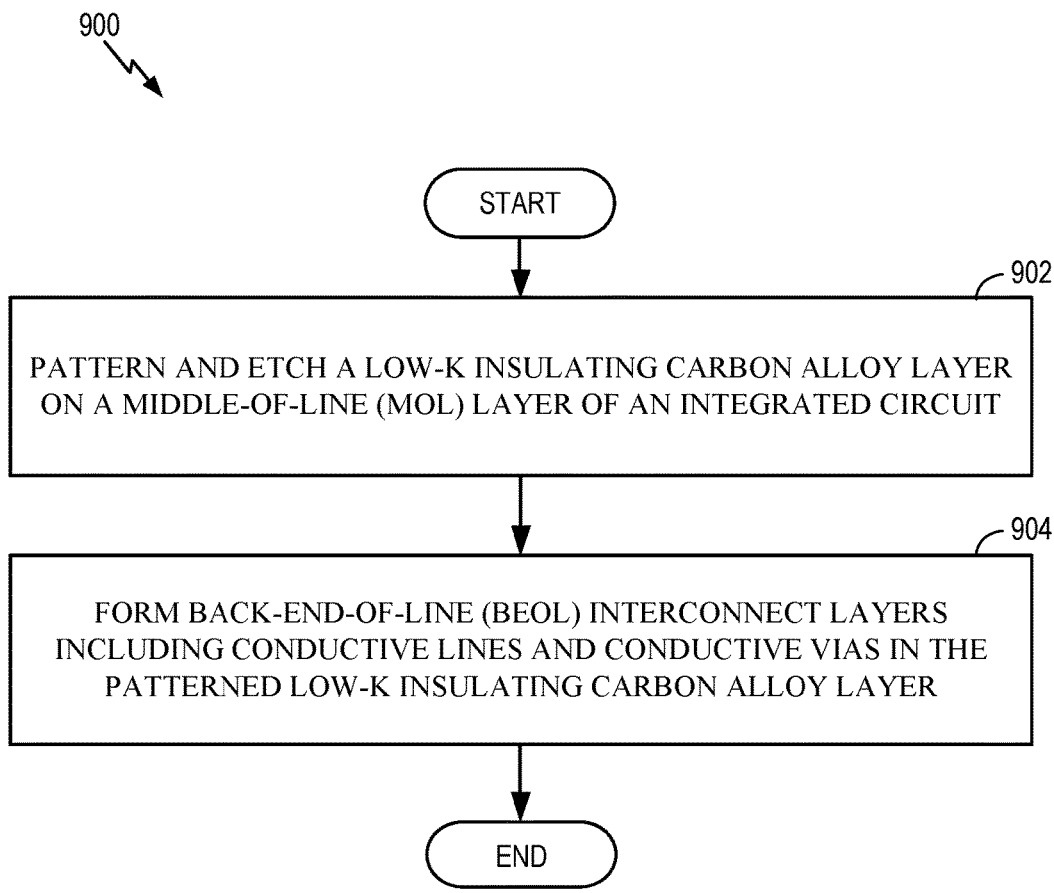
FIG. 9 illustrates a process flow diagram of a method for fabricating an integrated circuit (IC) device, according to aspects of the present disclosure.

FIG. 9 illustrates a process flow diagram of a method 900 for fabricating an integrated circuit (IC) device, according to aspects of the present disclosure. At block 902, a low-K insulating graphene alloy layer is patterned and etched on a middle-of-line (MOL) layer of the integrated circuit. For example, as shown in FIGS. 7A-7C and 8A-8C, the fluorographene layer 730/830 may be formed on a dielectric layer 710/810.

At block 904, back-end-of-line (BEOL) interconnect layers including conductive lines (e.g., M1, M2, etc.) and conductive vias are formed in the patterned low-K insulating graphene alloy layer. For example, as shown in FIGS. 7A-7C and 8A-8C, a lithography, deposition, and lift off process may be used to deposit a conductive line (e.g., copper (Cu)) in the fluorographene layer 730/830. Subsequently, similar processes as described herein may be repeated to deposit additional dielectric layers 710/810, fluorographene layers 730/830, and BEOL interconnect layers 740/840 (e.g., M1-M4, etc.). According to aspects, the BEOL interconnect layers 740/840 may include conductive lines and/or conductive vias. Additionally, as shown in FIGS. 6C, 6E, and 6F, the BEOL interconnect layers (e.g., 640, 650, 660, and 670) may be lined with a conformal dielectric liner 620 (e.g., SiNx, TaN, Co, etc.).

According to additional aspects of the present disclosure, the method 900 may further include growing a low-K dielectric layer on the MOL layer of the integrated circuit. Additionally, a low-K dielectric layer may be deposited on an active layer of the integrated circuit. For example, the low-K insulating graphene alloy layer may include fluorographene, oxidized graphene, or hydrogenated graphene.

According to an aspect of the present disclosure, an integrated circuit (IC) device is described. In one configuration, the IC device includes means for insulating. The insulating means may be a low-K insulating graphene alloy interlayer dielectric (ILD). In another aspect, the aforementioned means may be any module or any apparatus or material configured to perform the functions recited by the aforementioned means.

Figure 10:
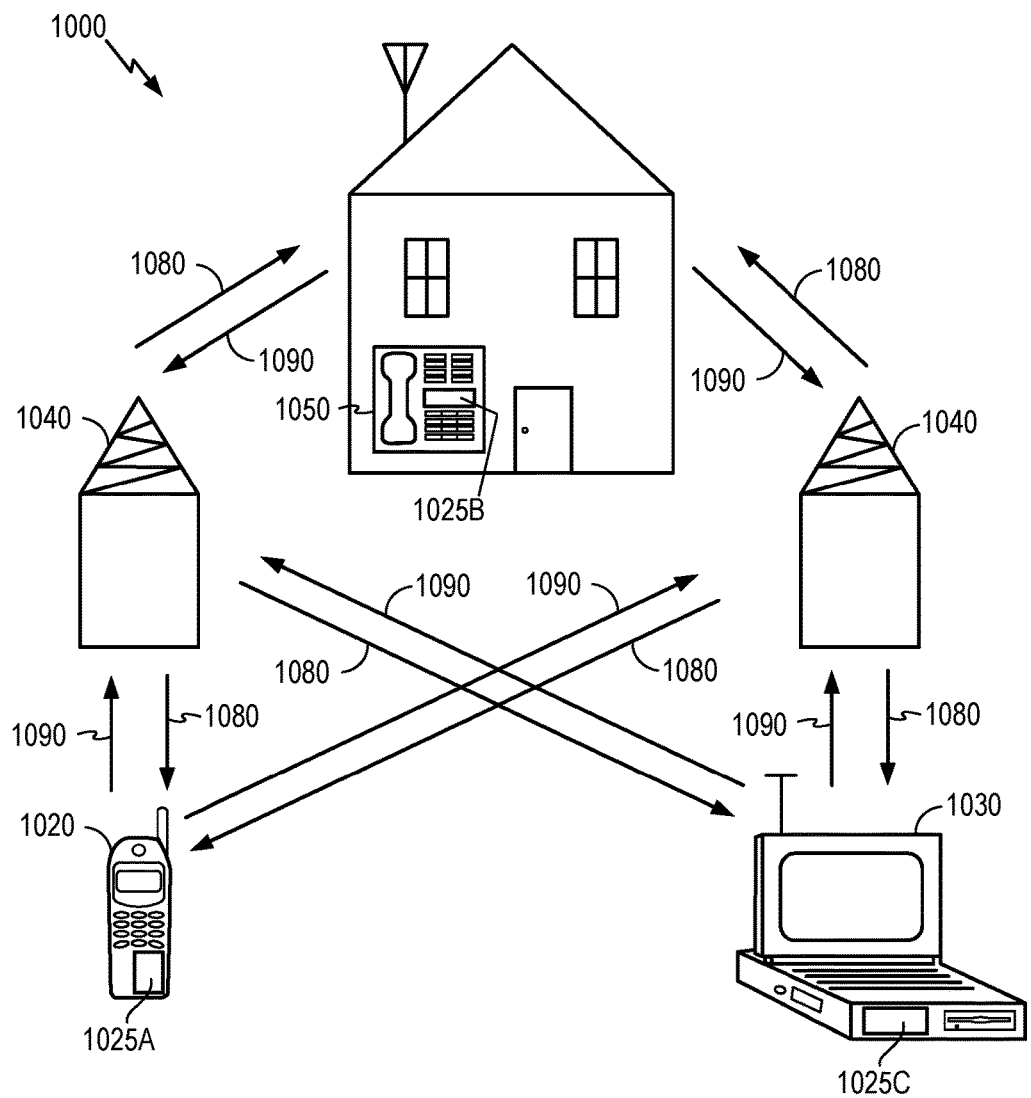
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed low-K insulating graphene alloy layer. It will be recognized that other devices may also include the disclosed low-K insulating graphene alloy layer, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed low-K insulating graphene alloy layer.

Figure 11:
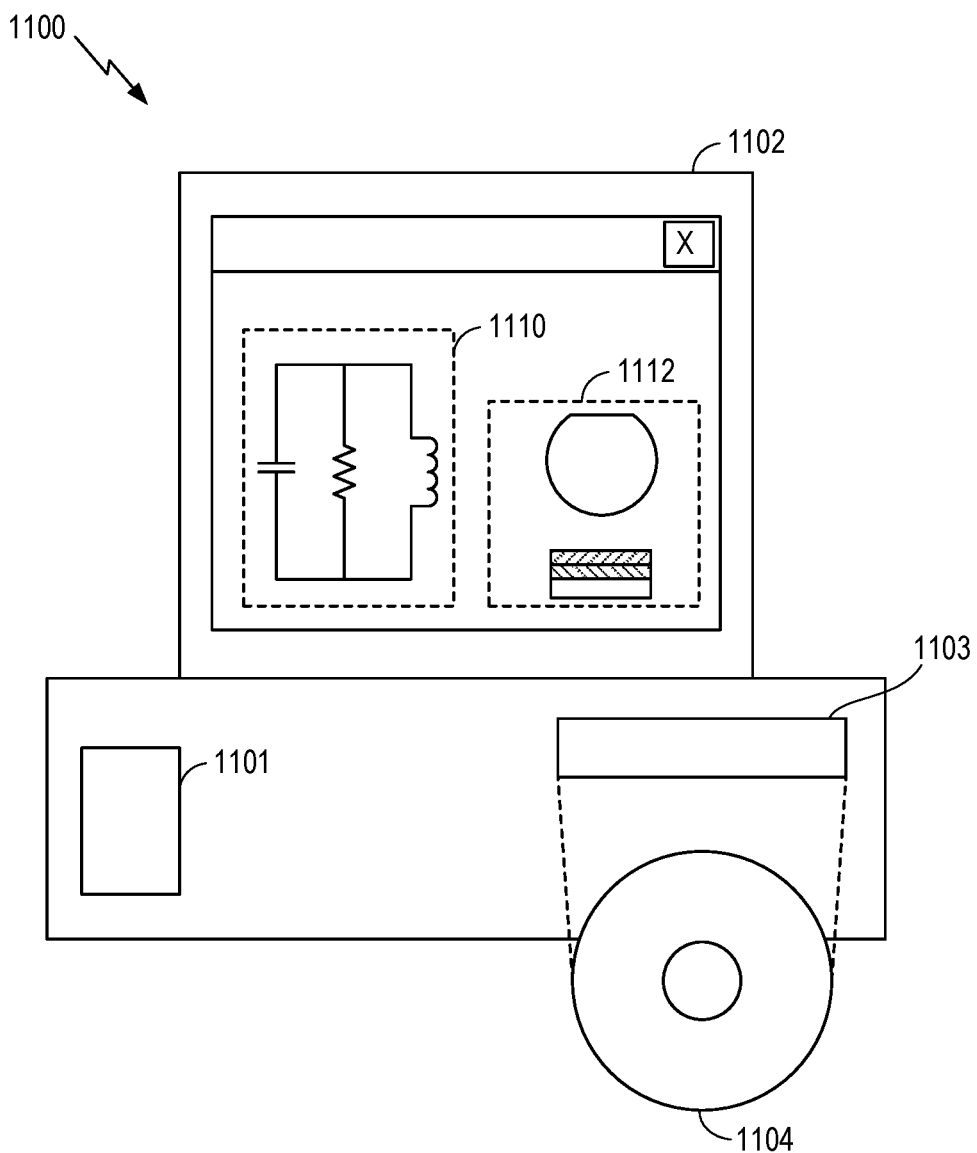
FIG. 11 is a block diagram illustrating a design workstation used for circuit, layout, and logic design of a fin-based structure according to one configuration.

FIG. 11 is a block diagram illustrating a design workstation used for circuit, layout, and logic design of an IC structure, such as the integrated circuit including a low-K insulating graphene alloy layer disclosed above. A design workstation 1100 includes a hard disk 1101 containing operating system software, support files, and design software such as Cadence or OrCAD. The design workstation 1100 also includes a display 1102 to facilitate design of a circuit 1110 or an IC device 1112 including a low-K insulating graphene alloy layer. A storage medium 1104 is provided for tangibly storing the design of the circuit 1110 or the IC device 1112. The design of the circuit 1110 or the IC device 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 including a low-K insulating graphene alloy layer.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit, comprising:
   a plurality of back-end-of-line (BEOL) interconnect layers comprising conductive lines and conductive vias; and
   a low-K interlayer dielectric (ILD) between the BEOL interconnect layers including the conductive lines and the conductive vias, in which the low-K ILD comprises a low-K dielectric fill material and a low-K insulating graphene alloy, disposed in alternating thin layers of the low-K dielectric fill material on the low-K insulating graphene alloy, each surrounding the plurality of BEOL interconnect layers.

2. The integrated circuit of claim 1, in which the low-K insulating graphene alloy comprises fluorographene, oxidized graphene, or hydrogenated graphene.

3. The integrated circuit of claim 1, in which the alternating layers have different thicknesses.

4. The integrated circuit of claim 1, in which the alternating layers have similar thicknesses.

5. The integrated circuit of claim 1, in which the conductive lines and the vias of the BEOL interconnect layers are at least partially lined with a conformal dielectric liner.

6. The integrated circuit of claim 5, in which the conformal dielectric liner comprises $SiN_x$.

7. The integrated circuit of claim 1, integrated into a mobile phone, a set top box, a music player, a video player, an entertainment unit, a navigation device, a computer, a hand-held personal communication systems (PCS) unit, a portable data unit, and/or a fixed location data unit.

8. A method of making an integrated circuit, comprising:
   patterning and etching a low-K insulating graphene alloy layer on a middle-of-line (MOL) layer of the integrated circuit by
   depositing a sacrificial catalyst layer on the MOL layer;
   diffusing a low resistivity carbon alloy through the sacrificial catalyst layer;
   removing the sacrificial catalyst layer; and
   fluorinating the low resistivity carbon alloy; and
   forming back-end-of-line (BEOL) interconnect layers including conductive lines and conductive vias in the patterned low-K insulating graphene alloy layer.

9. The method of claim 8, further comprising growing a low-K dielectric layer on the MOL layer of the integrated circuit.

10. The method of claim 8, further comprising depositing a low-K dielectric layer on an active layer of the integrated circuit.

11. The method of claim 8, in which the low-K insulating graphene alloy layer comprises fluorographene, oxidized graphene, or hydrogenated graphene.

12. The method of claim 8, in which the low resistivity carbon alloy comprises graphene.

13. The method of claim 8, in which the integrated circuit is integrated into a mobile phone, a set top box, a music player, a video player, an entertainment unit, a navigation device, a computer, a hand-held personal communication systems (PCS) unit, a portable data unit, and/or a fixed location data unit.

14. A method of making an integrated circuit, comprising:
   patterning and etching a low-K insulating graphene alloy layer on a middle-of-line (MOL) layer of the integrated circuit by:
      depositing a thin catalyst layer on the MOL layer;
      decomposing carbonaceous precursors from the thin catalyst layer; and
      fluorinating a low resistivity carbon alloy; and
   forming back-end-of-line (BEOL) interconnect layers including conductive lines and conductive vias in the patterned low-K insulating graphene alloy layer.

15. An integrated circuit, comprising:
   a plurality of back-end-of-line (BEOL) interconnect layers comprising means for conducting; and
   a low-K interlayer dielectric (ILD) between the BEOL interconnect layers including the means for conducting, in which the low-K ILD comprises a low-K dielectric material and a low-K insulating graphene alloy, disposed in alternating thin layers of the low-K dielectric fill material on the low-K insulating graphene alloy, each surrounding the plurality of BEOL interconnect layers.

16. The integrated circuit of claim 15, in which the low-K insulating graphene alloy comprises fluorographene, oxidized graphene, or hydrogenated graphene.

17. The integrated circuit of claim 15, integrated into a mobile phone, a set top box, a music player, a video player, an entertainment unit, a navigation device, a computer, a hand-held personal communication systems (PCS) unit, a portable data unit, and/or a fixed location data unit.

* * * * *